United States Patent
Sui

(10) Patent No.: US 11,846,682 B2
(45) Date of Patent: Dec. 19, 2023

(54) METHOD AND DEVICE FOR AVOIDING ABNORMAL SIGNAL OSCILLATION IN UVLO TEST

(71) Applicant: INSPUR SUZHOU INTELLIGENT TECHNOLOGY CO., LTD., Jiangsu (CN)

(72) Inventor: Xin Sui, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 162 days.

(21) Appl. No.: 17/603,717

(22) PCT Filed: Jul. 31, 2019

(86) PCT No.: PCT/CN2019/098498
§ 371 (c)(1),
(2) Date: Oct. 14, 2021

(87) PCT Pub. No.: WO2020/211220
PCT Pub. Date: Oct. 22, 2020

(65) Prior Publication Data
US 2022/0196755 A1 Jun. 23, 2022

(30) Foreign Application Priority Data
Apr. 15, 2019 (CN) .......................... 201910299678.7

(51) Int. Cl.
*G01R 31/40* (2020.01)
*G01R 19/10* (2006.01)
(Continued)

(52) U.S. Cl.
CPC ............ *G01R 31/40* (2013.01); *G01R 19/10* (2013.01); *G01R 19/16576* (2013.01); *G05F 1/46* (2013.01)

(58) Field of Classification Search
CPC .. G01R 31/40; G01R 19/10; G01R 19/16576; G01R 19/16552; G05F 1/46
(Continued)

(56) References Cited

U.S. PATENT DOCUMENTS 7,741,820 B2 6/2010 Huang et al.
11,422,201 B1 * 8/2022 Raschbacher .... G01R 19/16552
(Continued)

FOREIGN PATENT DOCUMENTS

CN 1700127 A 11/2005
CN 101071977 A 11/2007
(Continued)

OTHER PUBLICATIONS

Written Opinion and English Translation cited in PCT/CN2019/098498 dated Jan. 13, 2020, 8 pages.
(Continued)

*Primary Examiner* — Giovanni Astacio-Oquendo
(74) *Attorney, Agent, or Firm* — COOPER LEGAL GROUP, LLC

(57) ABSTRACT

A method and device for avoiding abnormal signal oscillation in UVLO test, applied to a power supply module, includes: a voltage detection module (301) detecting a voltage of an enable terminal of the power supply module during an under voltage lock out UVLO test; a difference calculation module (302) calculating a difference value between a detected voltage and a voltage trigger threshold of the enable terminal; upon a control module (303) determining that the difference value is below a preset first threshold, the control module increasing the voltage of the enable terminal during UVLO test via a voltage adjustment module. The application of the above solution of the present application can avoid abnormal signal oscillation in UVLO test.

12 Claims, 3 Drawing Sheets

(51) Int. Cl.
 *G01R 19/165* (2006.01)
 *G05F 1/46* (2006.01)
(58) Field of Classification Search
 USPC .................................. 324/764.01, 537, 500
 See application file for complete search history.

(56) References Cited

U.S. PATENT DOCUMENTS

| | | | |
|---|---|---|---|
| 2005/0253568 A1 | 11/2005 | Morimoto | |
| 2007/0263419 A1 | 11/2007 | Sasaki et al. | |
| 2011/0279101 A1 | 11/2011 | Sasaki et al. | |
| 2014/0312872 A1* | 10/2014 | Sato | G05F 1/565 323/303 |
| 2015/0022924 A1* | 1/2015 | Barrenscheen | G01R 19/16552 361/86 |
| 2021/0190858 A1* | 6/2021 | Sato | H03K 17/18 |
| 2021/0405125 A1* | 12/2021 | Zimek | G01S 7/4004 |
| 2022/0065945 A1* | 3/2022 | Quy | G01R 19/16538 |

FOREIGN PATENT DOCUMENTS

| | | |
|---|---|---|
| CN | 102565516 A | 7/2012 |
| CN | 102789255 A | 11/2012 |
| CN | 103917012 A | 7/2014 |
| CN | 104679091 A | 6/2015 |
| CN | 106253651 A | 12/2016 |
| CN | 108832806 A | 11/2018 |
| CN | 109032318 A | 12/2018 |
| CN | 109917307 A | 6/2019 |
| TW | 200934130 A | 8/2009 |

OTHER PUBLICATIONS

First Office Action and English Translation cited in CN2019102996787 dated Nov. 28, 2019, 10 pages.

Second Office Action and English Translation cited in CN2019102996787 dated Aug. 3, 2020, 13 pages.

Yu Qinghua et al., "An Improved UVLO Design Based on BCD Process", Electronic World, Issue 14, Dec. 1, 2011 (Dec. 1, 2011), 10 pages.

GUO Yuqing, "Self-lighting LED background lighting circuit Medicine for treating menoxenia" 2003, 12 pages.

* cited by examiner

METHOD AND DEVICE FOR AVOIDING ABNORMAL SIGNAL OSCILLATION IN UVLO TEST

RELATED APPLICATIONS

This application claims priority to the Chinese patent application No. 201910299678.7 filed with the Chinese Patent Office on Apr. 15, 2019, entitled "A method and apparatus for avoiding abnormal signal oscillation in UVLO test", the entire contents of which are incorporated herein by reference.

FIELD

The present disclosure relates to the technical field of server test, and in particular, to a method and apparatus for avoiding abnormal signal oscillation in UVLO test.

BACKGROUND

UVLO (under voltage lock out) refers to that a power supply chip does not operate and is in a protected state when the input voltage falls below a certain value. In the development stage of server motherboards and other boards, it is usually necessary to perform UVLO test on power supply modules to analyze whether the UVLO of the power supply module meets the requirements. However, in actual measurement, some power supply chips have large oscillation in the output signal when performing UVLO protection. And further tests reveal that the abnormal oscillation is not caused by an abnormal function of the UVLO of the power supply module, thus reducing the testing efficiency. And the abnormal oscillation will have an impact on a post-stage circuit. By way of example, when using the output signal as a pull-up level for other chip pins, if the oscillation amplitude and the oscillation pulse width both meet the trigger conditions for the chip pins, false triggering is caused, that is, the abnormal oscillation generated due to the fault of a pre-stage circuit affects the post-stage circuit.

In summary, how to avoid abnormal signal oscillation in UVLO test is a technical problem that urgently needed to be solved by those skilled in the art.

SUMMARY

The purpose of the present disclosure is to provide a method for avoiding abnormal signal oscillation in UVLO test, to avoid abnormal signal oscillation in UVLO test.

To solve the above technical problem, the present disclosure provides the following technical solutions:

a method for avoiding abnormal signal oscillation in UVLO test, applied to a power supply module, including:
detecting a voltage of an enable terminal of the power supply module during an under voltage lock out UVLO test by a voltage detection module;
calculating a difference value between a detected voltage and a voltage trigger threshold of the enable terminal by a difference calculation module;
upon a control module determining that the difference value is below a preset first threshold, the control module increasing the voltage of the enable terminal during UVLO test via a voltage adjustment module.

Preferably, the step of upon a control module determining that the difference value is below a preset first threshold, the control module increasing the voltage of the enable terminal during UVLO test via a voltage adjustment module includes:
upon the control module determining that the difference value is below a preset first threshold, the control module increasing the voltage of the enable terminal during UVLO test by adjusting a voltage divider module connected to the enable terminal.

Preferably, the voltage divider module includes a first resistor module and a second resistor module, wherein, a first end of the first resistor module is configured for receiving input voltage from the power supply module, a second end of the first resistor module is configured to be connected to a first end of the second resistor module and the enable terminal, and a second end of the second resistor module is grounded;
adjusting a voltage divider module connected to the enable terminal, including:
increasing impedance of the second resistor module.

Preferably, the first resistor module includes a first resistor and the second resistor module includes a first potentiometer.

Preferably, increasing impedance of the second resistor module includes
moving, by a driving device, a brush of the first potentiometer to increase the impedance of the second resistor module.

Preferably, the voltage adjustment module includes a first power supply and a first switch circuit, the first switch circuit being connected between the first power supply and the enable terminal;
the step of upon a control module determining that the difference value is below a preset first threshold, the control module increasing the voltage of the enable terminal during UVLO test via a voltage adjustment module includes:
the control module, upon determining that the difference value is below the preset first threshold, controlling the first switch circuit in a conduction state to enable the enable terminal to receive power from the first power supply, thereby increasing the voltage of the enable terminal during the UVLO test.

Preferably, after determining that the difference value is below the preset first threshold, the method further includes:
outputting prompt messages by the control module.

Preferably, the power supply module is a power supply module using MPQ8632GLE-6-Z.

An apparatus for avoiding abnormal signal oscillation in UVLO test, applied to a power supply module, including:
a voltage detection module for detecting a voltage of an enable terminal of the power supply module during an under voltage lock out UVLO test;
a difference calculation module for calculating a difference value between a detected voltage and a voltage trigger threshold of the enable terminal;
a control module for, upon determining that the difference value is below the preset first threshold, increasing the voltage of the enable terminal during UVLO test via a voltage adjustment module.

Preferably, the control module is specifically for:
upon determining that the difference value is below the preset first threshold, increasing the voltage of the enable terminal during the UVLO test by adjusting a voltage divider module connected to the enable terminal.

The technical solution provided by the embodiments of the present disclosure, applied to a power supply module, includes: detecting a voltage of an enable terminal of the power supply module during an under voltage lock out UVLO test by a voltage detection module; calculating a difference value between a detected voltage and a voltage trigger threshold of the enable terminal by a difference calculation module; upon a control module determining that the difference value is below a preset first threshold, the control module increasing the voltage of the enable terminal during UVLO test via a voltage adjustment module.

The applicant found that the voltage of the enable terminal of the power supply module with abnormal oscillation during the UVLO test is usually near the voltage trigger threshold. It was found in further analysis that the voltage of the enable terminal of the power module is higher than the voltage trigger threshold by a certain value during normal operation, and during the UVLO test, the voltage of the enable terminal is lowered to near the voltage trigger threshold because the input voltage is lowered. At this time, the enable terminal and the power supply module will be in an unstable state, which leads to abnormal oscillation in the output voltage of the power supply module during the UVLO test. Therefore, in the present application, when it is determined that the difference value between the detected voltage of the enable terminal and the voltage trigger threshold of the enable terminal is lower than the preset first threshold, the voltage of the enable terminal is increased during the UVLO test, thus avoiding an unstable state of the enable terminal and eliminating the abnormal oscillation of the output signal of the power supply module due to the instability of the enable terminal.

BRIEF DESCRIPTION OF THE DRAWINGS

To more clearly illustrate the technical solutions in the embodiments of the present disclosure or the prior art, the following is a brief description of the accompanying drawings that need to be used in the description of the embodiments or prior art. It is apparent that the accompanying drawings in the following description are only some embodiments of the present disclosure, and other accompanying drawings can be obtained from these drawings without any creative work for a person of ordinary skill in the art.

DETAILED DESCRIPTION

The core of the present disclosure is to provide a method for avoiding abnormal signal oscillation in UVLO test, which can avoid abnormal signal oscillation in UVLO test.

To enable those skilled in the art to better understand the solution of the present disclosure, the present disclosure will be further described in detail below with reference to the accompanying drawings and specific embodiments. Apparently, the described embodiments are only a part of the embodiments of the present disclosure, rather than all the embodiments. Based on the embodiments of the present disclosure, all other embodiments obtained by those skilled in the art without creative work shall fall within the protection scope of the present disclosure.

Figure 1:
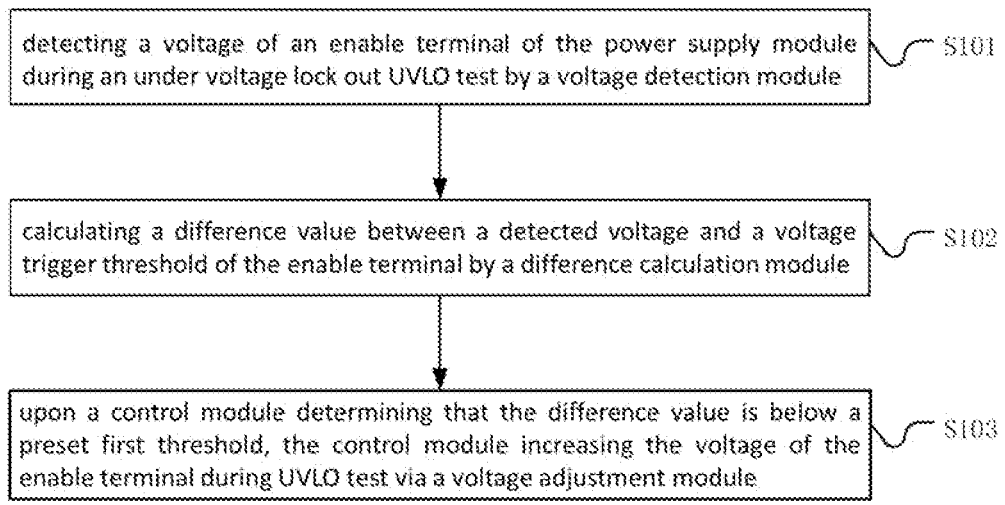
FIG. 1 is a flow chart of an embodiment of a method for avoiding abnormal signal oscillation in UVLO test according to the present disclosure.

Referring to FIG. 1, FIG. 1 is a flow chart of an embodiment of a method for avoiding abnormal signal oscillation in UVLO test according to the present disclosure, which method is applied to a power supply module and may include the following steps.

Step S101: detecting a voltage of an enable terminal of the power supply module during an under voltage lock out UVLO test by a voltage detection module.

Figure 2:
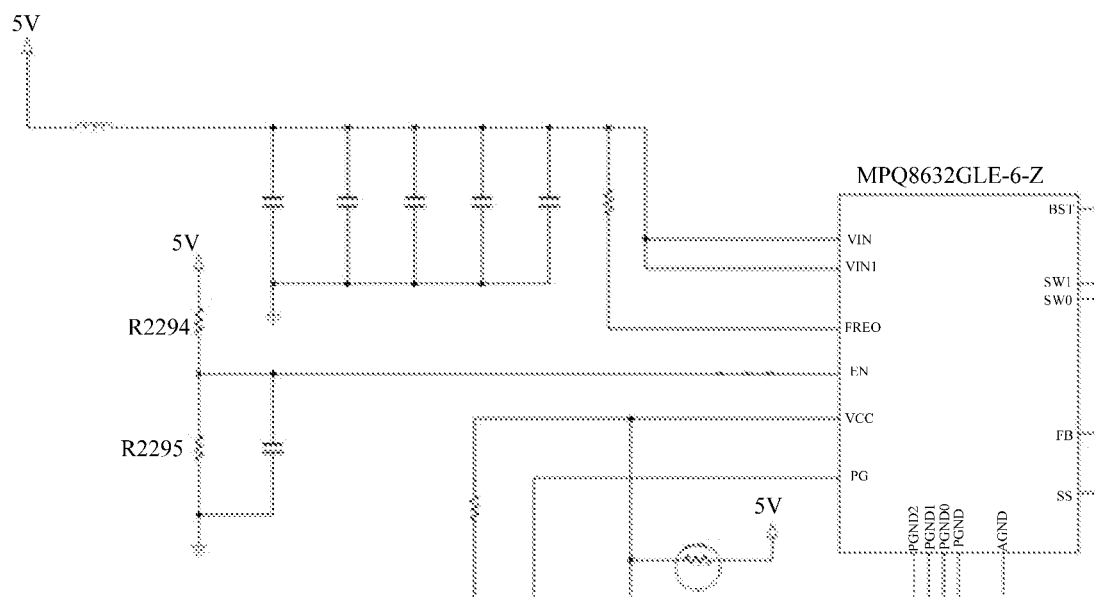
FIG. 2 is a schematic diagram of the chip structure of a power supply module using the MPQ8632GLE-6-Z.

The applicant found that the voltage of the enable terminal of the power supply module with abnormal oscillation during the UVLO test is usually near the voltage trigger threshold. Therefore, the applicant considered that the abnormal signal oscillation during the UVLO test was caused by the voltage problem at the enable terminal. It was found in further analysis that the voltage of the enable terminal of the power module is higher than the voltage trigger threshold by a certain value during normal operation, and during the UVLO test, the voltage of the enable terminal is lowered to near the voltage trigger threshold because the input voltage is lowered. At this time, the enable terminal and the power supply module will be in an unstable state, which leads to abnormal oscillation in the output voltage of the power supply module during the UVLO test. For example, FIG. 2 is a schematic diagram of the chip of a power supply module using the MPQ8632GLE-6-Z, and the power supply module using the MPQ8632GLE-6-Z often experiences abnormal oscillation during UVLO test. As can be seen from FIG. 2, the enable terminal signal is derived from the input signal through the voltage divider resistor R2295, and the voltage of the enable terminal is relatively low, around 1.5V, during the UVLO test, while the threshold of the voltage of the enable terminal of the MPQ8632GLE-6-Z chip is exactly 1.5V. Since the enable terminal and the power supply module are in an unstable state, it causes the output voltage of the power supply module to oscillate abnormally during the UVLO test.

Therefore, in the solution of the present application, the voltage detection module is first used to detect the voltage of the enable terminal of the power supply module during the UVLO test. The voltage detection module can be a commonly used voltage detection circuit. Of course, the specific circuit configuration can be in various forms, as long as it can achieve the detection of the voltage of the enable terminal, and does not affect the implementation of the present disclosure.

Step S102: calculating a difference value between a detected voltage and a voltage trigger threshold of the enable terminal by a difference calculation module.

The voltage detection module can output the detected enable terminal voltage to the difference calculation module, which can be a comparator that compares the received enable terminal voltage with the preset enable terminal voltage trigger threshold to find out the difference value. Of course, in actual applications, the chips used in the power supply module may be different, and the voltage trigger threshold of the enable terminal preset on the difference calculation module may be adjusted accordingly.

Step S103: upon a control module determining that the difference value is below a preset first threshold, the control module increasing the voltage of the enable terminal during UVLO test via a voltage adjustment module.

When the difference value between the detected enable terminal voltage and the voltage trigger threshold is higher than the preset first threshold, it means that the enable terminal voltage and the power supply module will be in a stable state during the UVLO test and will not cause abnormal signal oscillation. Accordingly, when the control module determines that the difference value is lower than the preset first threshold, it means that the enable terminal voltage and the power supply module will be in an unstable state, and the control module will increase the voltage of the enable terminal during the UVLO test through the voltage adjustment module, to ensure the normal progress of the UVLO test.

The specific value of the first threshold can be set and adjusted according to the actual situation, and can usually be determined according to experimental data. When increasing the voltage of the enable terminal by the voltage adjustment module, the degree and the way of voltage increase can also be set and adjusted according to actual needs. For example, the voltage of the enable terminal can be increased by increasing the resistance of the voltage divider resistor connected to the enable terminal, for example, a stable voltage signal can be directly input to the enable terminal, and so on.

The method for avoiding abnormal signal oscillation in UVLO test provided by the embodiments of the present disclosure, applied to a power supply module, includes: detecting a voltage of an enable terminal of the power supply module during an under voltage lock out UVLO test by a voltage detection module; calculating a difference value between a detected voltage and a voltage trigger threshold of the enable terminal by a difference calculation module; upon a control module determining that the difference value is below a preset first threshold, the control module increasing the voltage of the enable terminal during UVLO test via a voltage adjustment module.

The applicant found that the voltage of the enable terminal of the power supply module with abnormal oscillation during the UVLO test is usually near the voltage trigger threshold. It was found in further analysis that the voltage of the enable terminal of the power module is higher than the voltage trigger threshold by a certain value during normal operation, and during the UVLO test, the voltage of the enable terminal is lowered to near the voltage trigger threshold because the input voltage is lowered. At this time, the enable terminal and the power supply module will be in an unstable state, which leads to abnormal oscillation in the output voltage of the power supply module during the UVLO test. Therefore, in the present application, when it is determined that the difference value between the detected voltage of the enable terminal and the voltage trigger threshold of the enable terminal is lower than the preset first threshold, the voltage of the enable terminal is increased during the UVLO test, thus avoiding an unstable state of the enable terminal and eliminating the abnormal oscillation of the output signal of the power supply module due to the instability of the enable terminal.

In a specific embodiment of the present disclosure, step S103 may be specified as follows.

upon the control module determining that the difference value is below a preset first threshold, the control module increasing the voltage of the enable terminal during UVLO test by adjusting a voltage divider module connected to the enable terminal.

In this embodiment, the voltage adjustment module is specifically a voltage divider module, that is, in this embodiment, the enable terminal obtains voltage through the voltage divider module, and the control module can adjust the voltage divider module so that the voltage of the enable terminal is controlled by the control module.

When the voltage divider module is used as the voltage adjustment module, the solution is relatively simple and easy to implement, and the voltage divider module can be implemented by resistors, inductors, and other devices, and the cost is relatively low.

In a specific embodiment, the voltage divider module may include a first resistor module and a second resistor module, wherein, a first end of the first resistor module is configured for receiving input voltage from the power supply module, a second end of the first resistor module is configured to be connected to a first end of the second resistor module and the enable terminal, and a second end of the second resistor module is grounded.

In this embodiment, adjusting the voltage divider module connected to the enable terminal in step S103 can be specified as increasing the impedance of the second resistor module.

In this embodiment, the voltage divider module includes a first resistor module and a second resistor module, and the voltage of the enable terminal is determined by the resistance value of the first resistor module, the resistance value of the second resistor module, and the input voltage of the power supply module. Therefore, when the control module needs to increase the voltage of the enable terminal during the UVLO test, it can be achieved by increasing the impedance of the second resistor module.

Further, the first resistor module may include a first resistor and the second resistor module may include a first potentiometer. For example, for the MPQ8632GLE-6-Z chip in FIG. 2, the resistor R2294 in the original circuit may be used as the first resistor and the original voltage divider resistor R2295 may be replaced with a first potentiometer. Since the voltage divider module is composed of a first resistor and a first potentiometer, such a solution has a low cost and is especially suitable for the situation where the enable terminal in the original circuit obtains the voltage through voltage division.

It should be noted that the control module, when increasing the impedance of the first potentiometer, the brush of the first potentiometer can be moved by the driving device, thereby increasing the impedance of the first potentiometer. The control module can be a controller additionally provided in the solution of the present application, or the controller in the original boards can be utilized. The specific configuration of the driving device can also be set according to actual needs, as long as it can accept the control of the control module and increase the impedance of the first potentiometer.

In a specific embodiment according to the present disclosure, the voltage adjustment module includes a first power supply and a first switch circuit, the first switch circuit being connected between the first power supply and the enable terminal.

In this embodiment, step S103 may be specified as follows.

the control module, upon determining that the difference value is below the preset first threshold, controlling the first switch circuit in a conduction state to enable the enable terminal to receive power from the first power supply, thereby increasing the voltage of the enable terminal during the UVLO test.

In this embodiment, when the controller needs to increase the voltage of the enable terminal during the UVLO test, it will control the first switch circuit to conduct, so that the enable terminal will receive power from the first power supply. The first power supply can be selected as a DC voltage source. In this embodiment, considering the relatively complex way of adjusting the resistor, a relatively high voltage signal can be directly input to the enable terminal to make the voltage of the enable terminal stable.

In a specific embodiment of the present disclosure, after step S103, the control module may also output a prompt message, so that the tester can notice the situation in time.

Figure 3:
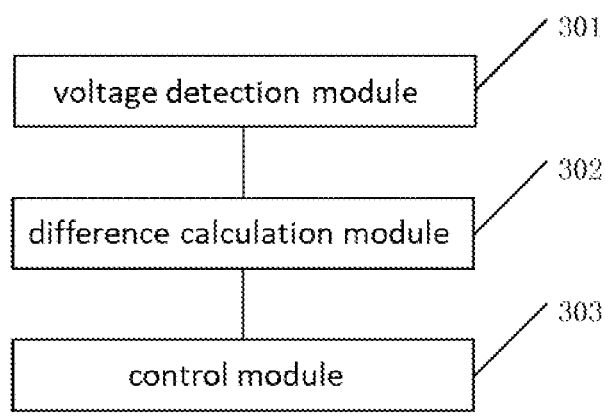
FIG. 3 is a schematic diagram of the structure of an apparatus for avoiding abnormal signal oscillation in UVLO test according to the present disclosure.

Corresponding to the above embodiment of the method, the embodiment of the present disclosure also provides an apparatus for avoiding abnormal signal oscillation in UVLO test, which can be cross-referenced with the above description. Referring to FIG. 3, the apparatus for avoiding abnormal signal oscillation in UVLO test is applied to a power supply module and may include:

a voltage detection module 301 for detecting a voltage of an enable terminal of the power supply module during an under voltage lock out UVLO test;

a difference calculation module 302 for calculating a difference value between a detected voltage and a voltage trigger threshold of the enable terminal;

a control module 303 for, upon determining that the difference value is below the preset first threshold, increasing the voltage of the enable terminal during UVLO test via a voltage adjustment module.

In a specific embodiment of the present disclosure, the control module 303 is specifically used for:

upon determining that the difference value is below a preset first threshold, the control module increasing the voltage of the enable terminal during UVLO test by adjusting a voltage divider module connected to the enable terminal.

In a specific embodiment according to the present disclosure, the voltage divider module may include a first resistor module and a second resistor module, wherein, a first end of the first resistor module is configured for receiving input voltage from the power supply module, a second end of the first resistor module is configured to be connected to a first end of the second resistor module and the enable terminal, and a second end of the second resistor module is grounded;

the control module 303 is specifically used for increasing the impedance of the second resistor module to increase the voltage of the enable terminal during the UVLO test upon determining that the difference value is below the preset first threshold.

Further, the first resistor module includes a first resistor and the second resistor module includes a first potentiometer.

The control module 303 is specifically used for, upon determining that the difference value is below a preset first threshold, moving the brush of the first potentiometer by a driving device to increase the impedance of the second resistor module to increase the voltage of the enable terminal during the UVLO test.

In a specific embodiment according to the present disclosure, the voltage adjustment module includes a first power supply and a first switch circuit, the first switch circuit being connected between the first power supply and the enable terminal.

the control module 303 is specifically used for, upon determining that the difference value is below the preset first threshold, controlling the first switch circuit in a conduction state to enable the enable terminal to receive power from the first power supply, thereby increasing the voltage of the enable terminal during the UVLO test.

In one specific embodiment of the present disclosure, the control module is also used to output prompt messages.

In one specific embodiment of the present disclosure, the power supply module is a power supply module using MPQ8632GLE-6-Z.

It is also noted that in this specification, relationship terms such as first and second are used only to distinguish one entity or operation from another entity or operation, without necessarily requiring or implying any such actual relationship or order between those entities or operations. Further, the terms "include" "comprise" or any other variation thereof are intended to cover non-exclusive inclusion, such that a process, method, article, or apparatus that includes a set of elements includes not only those elements, but also other elements not expressly listed, or also include elements that are inherent to such process, method, article, or apparatus. Without further limitation, the elements defined by the statement "comprising a . . . " do not preclude the existence of additional identical elements in the process, method, article, or apparatus that include said elements.

The skilled person may further realize that the units and algorithmic steps of each example described in conjunction with the embodiments disclosed herein are capable of being implemented in electronic hardware, computer software, or a combination of both, and that the composition and steps of each example have been described generally by function in the above description to clearly illustrate the interchangeability of hardware and software. Whether these functions are performed in hardware or software depends on the particular application and design constraints of the technical solution. The skilled person may use different methods to implement the described functions for each particular application, but such implementation should not be considered as going beyond the scope of the present disclosure.

Specific examples are applied in this specification to illustrate the principle and embodiments of the present disclosure, and the above description of the embodiments is only used to help understand the technical solution of the present disclosure and the core idea thereof. It should be noted that for a person of ordinary skill in the art, several improvements and modifications can be made to the present disclosure without departing from the principle of the present disclosure, and these improvements and modifications also fall within the scope of protection of the claims of the present disclosure.

The invention claimed is:

1. A method for avoiding abnormal signal oscillation in under voltage lock out (UVLO) test, applied to a power supply module, comprising:

detecting a voltage of an enable terminal of the power supply module during the UVLO test;

calculating a difference value between the voltage and a voltage trigger threshold of the enable terminal; and in response to the difference value being below a preset first threshold, increasing the voltage of the enable terminal during the UVLO test.

2. The method for avoiding abnormal signal oscillation in UVLO test of claim 1, wherein, the step of in response to the difference value being below the preset first threshold, increasing the voltage of the enable terminal during the UVLO test comprises:

in response to the difference value being below the preset first threshold, increasing the voltage of the enable terminal during the UVLO test by adjusting a voltage divider module connected to the enable terminal.

3. The method for avoiding abnormal signal oscillation in UVLO test of claim 2, wherein, the voltage divider module comprises a first resistor module and a second resistor module, wherein, a first end of the first resistor module is configured for receiving an input voltage from the power supply module, a second end of the first resistor module is configured to be connected to a first end of the second resistor module and the enable terminal, and a second end of the second resistor module is grounded;

wherein the step of adjusting the voltage divider module connected to the enable terminal comprises:

increasing impedance of the second resistor module.

4. The method for avoiding abnormal signal oscillation in UVLO test of claim 3, wherein, the first resistor module comprises a first resistor and the second resistor module comprises a first potentiometer.

5. The method for avoiding abnormal signal oscillation in UVLO test of claim 4, wherein, the step of increasing the impedance of the second resistor module comprises:

moving, by a driving device, a brush of the first potentiometer to increase the impedance of the second resistor module.

6. The method for avoiding abnormal signal oscillation in UVLO test of claim 5, wherein, the power supply module is a power supply module using MPQ8632GLE-6-Z.

7. The method for avoiding abnormal signal oscillation in UVLO test of claim 2, wherein, the power supply module is a power supply module using MPQ8632GLE-6-Z.

8. The method for avoiding abnormal signal oscillation in UVLO test of claim 3, wherein, the power supply module is a power supply module using MPQ8632GLE-6-Z.

9. The method for avoiding abnormal signal oscillation in UVLO test of claim 4, wherein, the power supply module is a power supply module using MPQ8632GLE-6-Z.

10. The method for avoiding abnormal signal oscillation in UVLO test of claim 1, wherein, in response to the difference value being below the preset first threshold, the method further comprises: outputting a prompt message.

11. The method for avoiding abnormal signal oscillation in UVLO test of claim 10, wherein, the power supply module is a power supply module using MPQ8632GLE-6-Z.

12. The method for avoiding abnormal signal oscillation in UVLO test of claim 1, wherein, the power supply module is a power supply module using MPQ8632GLE-6-Z.

* * * * *